United States Patent
Snijders et al.

(10) Patent No.: US 6,551,404 B2
(45) Date of Patent: Apr. 22, 2003

(54) APPARATUS FOR TREATING A WAFER

(75) Inventors: Gert-Jan Snijders, Amersfoort (NL); Vladimir Ivanovich Kuznetsov, Delft (NL); Christianus Gerardus M. de Ridder, Hoogland (NL); Herbert Terhorst, Amersfoort (NL)

(73) Assignee: ASM International N.V., Bilthoven (NL)

( * ) Notice: Subject to any disclaimer, the term of this patent is extended or adjusted under 35 U.S.C. 154(b) by 17 days.

(21) Appl. No.: 09/747,275

(22) Filed: Dec. 22, 2000

(65) Prior Publication Data

US 2001/0006095 A1 Jul. 5, 2001

(30) Foreign Application Priority Data

Dec. 23, 1999 (NL) .............................. 1013938

(51) Int. Cl.[7] .......................... H01L 21/20; C23C 16/00
(52) U.S. Cl. ...................... 118/725; 118/733; 118/728; 118/715
(58) Field of Search .................. 118/725, 733, 118/715, 724; 156/345.51, 345.52, 345.33

(56) References Cited

U.S. PATENT DOCUMENTS

| 5,370,709 A | 12/1994 | Kobayashi | 29/25.01 |
| 5,854,468 A | 12/1998 | Muka | 219/443 |
| 5,997,963 A | * 12/1999 | Davison et al. | 118/722 |

FOREIGN PATENT DOCUMENTS

| EP | 0 669 642 A2 | 8/1995 |
| WO | WO 90/13687 | 11/1990 |
| WO | WO 98/01890 | 1/1998 |

* cited by examiner

Primary Examiner—Gregory Mills
Assistant Examiner—Ram N Kackar
(74) Attorney, Agent, or Firm—Weingarten, Schurgin, Gagnebin & Lebovici LLP

(57) ABSTRACT

An apparatus for treating a wafer manufactured from semi-conducting material, the apparatus comprising a first and a second housing part arranged for movement away front and towards each other, the two housing parts bounding a treatment chamber, while around the treatment chamber there is provided a first groove connected to gas discharge means, while in at least one of the two boundary surfaces there is provided a second groove connected to gas feed means, the first groove being located radially within the second groove, and, in use, the pressure created by the gas feed means being such that from the second groove, gas flows both in radial inward and in radial outward direction in the gap between the first and the second boundary surface.

24 Claims, 10 Drawing Sheets

APPARATUS FOR TREATING A WAFER

The invention provides an apparatus for treating a wafer manufactured from semiconducting material, the apparatus comprising a first and a second housing part arranged for movement away from and towards each other, the two housing parts in a closed position, moved together, bounding a treatment chamber, at least one gas feed channel being provided in the first and/or second housing part which opens into the treatment chamber, the first and the second housing part around the treatment chamber being provided with a first and second boundary surface respectively, while in the closed position a gap is present between the first and the second boundary surface for discharging the gas fed into the treatment chamber in radially outward direction.

Such apparatus is known from Dutch patent application 103538 in applicant's name. The apparatus described is intended for performing a temperature treatment on a wafer manufactured from semiconducting material. The temperature treatment comprises, for instance, the steps of heating up a wafer within a short time, which wafer is subsequently held at a desired treatment temperature during a treatment period, for instance for annealing a doping. During this treatment period, a treatment gas may also be fed to the wafer, for instance for depositing material onto the wafer or etching material therefrom. The dimensions of the structures created on or in the wafer and the sharpness of the boundary surfaces between the structures and the bulk of the semiconducting material require a precision in the nanometer range. Greater variations may already inhibit or even impede the desired operation of the structures formed by the treatment.

Apparatuses for performing such temperature treatment on a wafer are already known in various other versions, for instance apparatuses where the wafer is irradiated by infrared lamps, or apparatuses where the wafer is placed directly on a temperature treatment surface, such as a heated plate. The drawback of these apparatuses is that the heat transfer between the wafer and the temperature treatment means of the apparatus is not uniform. This may lead to undesired effects. Thus, the non-uniform heat transfer may effect local overheating and/or underheating in the wafer, causing tensions in the wafer. Relaxation of these tensions results in dislocations and other defects in the crystalline semiconducting material of the wafer. These defects can degrade the electric properties of the material such that it no longer meets the desired specifications and becomes unusable for the intended application. In the second place, the heat transfer affects the course of the temperature-sensitive wafer treatment steps such as the deposition of material or the annealing of a doping introduced. Due to a non-uniform heat transfer, the temperature of the wafer to be treated is not uniform. Accordingly, during the treatment, the treatment period on some parts of the wafer is too short or too long, as a consequence of which the material is undertreated or overtreated respectively at those locations. Thus, at those locations of the wafer, this treatment does not lead to the desired electric and/or material properties, due to the non-uniform temperature of the wafer, so that in this way, too, the wafer may become unsuitable for further use.

The problems of a non-uniform heat transfer are avoided in the apparatus from Dutch patent 103538. To that end, the apparatus comprises a first and a second housing part, arranged for movement away from and towards each other. The two housing parts are brought to a specific treatment temperature. In fact, the temperature for the two housing parts may be different. The wafer to be treated is enclosed between the two housing parts in a treatment chamber. This involves the absence of mechanical contact between the two housing parts relative to each other. A gap between two boundary surfaces of the housing parts is sealed by a gas flowing radially outwards over the entire circumference and coming from the treatment chamber. The volume of the treatment chamber encloses the wafer very tightly, so that the heat transfer between the wafer and the two housing parts is effected substantially by means of a uniform heat conduction and only for a small part by radiation. As a consequence, the wafer rapidly takes over the temperature of the two housing parts. The housing parts have a very great heat capacity in relation to the wafer, so that the temperature of the housing parts hardly changes through the heat loss due to the heat transfer to the wafer. In the closed position of the two housing parts, moved towards each other, the treatment chamber should be closed off from the environment of the apparatus, such that no contaminants from the ambient air of the apparatus can reach the treatment chamber. Indeed, it is important that during the treatment in the treatment chamber, the wafer surface cannot contact such contaminants. During the treatment, this contaminant may adhere to the wafer surface or be incorporated into a layer deposited by the treatment, and accordingly render the wafer unusable for subsequent treatment steps and desired applications.

In the above-described apparatus, gas from the treatment chamber is used for sealing the gap between the two housing parts. Such contactless seal is preferred to a mechanical seal, which involves a contact surface between the two housing parts. After all, a mechanical seal must typically be of complex design to establish a proper closure of the treatment chamber. In that case, for instance an O-ring should be used, which is compressed in the contact surface when the housing parts are moved towards each other. In addition, such seal is subject to wear caused by the mechanical contact at the contact surface. Due to this wear, the quality of the seal between the two housing parts deteriorates upon repeated use. Moreover, due to the wear, particles are released from the housing parts. These particles may end up in the treatment chamber and accordingly contaminate the wafer surface. Such mechanical seal becomes additionally complicated if the housing parts are each brought to a treatment temperature for the treatment. Expansion of the hot housing parts may cause gaps in the contact surface, whereby the seal is broken. Moreover, the proper sealing of the hot housing parts is cumbersome when an O-ring is used.

In practice, the contactless closing of the two housing parts, with the gap between the housing parts being sealed by gas from the treatment chamber, is not sufficient to bring the contamination level in the treatment chamber to a desired low level. Indeed, via the gap, contamination from the environment may diffuse in the treatment chamber. A second drawback of the described sealing of the gap between the two housing parts is that a treatment gas to be used in the treatment space flows away to the environment of the apparatus via the gap. Many gases that serve for performing a wafer treatment are toxic and/or highly flammable upon contact with air, for instance silane, disilane and phosphine. In that case, it is important to avoid possible contact of this treatment gas with the ambient air.

The object of the present invention is to provide a solution to these problems. According to the invention, an apparatus of the type described in the preamble is characterized in that in at least one of the two boundary surfaces, there is provided a first groove connected to gas discharge means, while in at least one of the two boundary surfaces, there is provided a second groove connected to gas feed means, both the first and the second groove extending substantially along the circumference of the treatment chamber, the first groove being located radially within the second groove, and, in use, the pressure created by the gas feed means being such that from the second groove, gas flows both in radial inward and in radial outward direction in the gap between the first and the second boundary surface.

In use, a wafer is introduced into the treatment chamber between the two housing parts. Gas flowing through the gap is discharged via the first groove by the gas discharge means, while via the second groove, gas is fed to the gap by the gas feed means. The gas discharged via the first groove comes from the at least one gas feed channel which opens into the treatment chamber, and may further comprise a portion of the gas from the second groove. Thus, the gap is sealed by the gas streams, so that contamination from the environment can hardly diffuse to the treatment chamber.

The gas fed to the second groove by gas feed means flows from the second groove through the gap between the two housing parts in radially inward as well as radially outward direction. In this manner, gas from the treatment chamber is directly discharged by the gas discharge means connected to the first groove. The gas fed to the second groove by the gas feed means provides for the desired sealing of the gap outside the circumference of the first groove. The effect thus achieved is that the treatment chamber is properly separated from the environment by the gas flowing from the gas feed means. It is observed that the first and second boundary surfaces do not necessarily extend parallel to the treatment chamber. The two housing parts may, for instance, have mating cylindrical forms, with the two boundary surfaces extending along the outer wall of the inner cylindrical form and the inner wall of the outer cylindrical form. Also, the boundary surfaces may, for instance, extend along a section of a conical surface.

In use of the apparatus, the Péclet number in the gap located radially outside the second groove is preferably greater than 10, the Péclet number Pe being defined by the following formula:

$$Pe = \frac{v \cdot L}{D}$$

wherein v is the gas flow rate in the gap, L is the length of the gap viewed in flowing direction, and D is the diffusion coefficient of a contamination in the gas fed by the gas feed channels. At this Péclet number in the gap, diffusion of a contamination from the environment to the treatment chamber via the gap is very slight, so that a desired low contamination level is reached in the treatment chamber. This Péclet number can in most cases be achieved by taking a gas flow rate in the gap of the radially outwardly flowing gas of minimally 1 centimeter per second.

In a preferred embodiment, in use, the pressure created by the gas discharge means is such that substantially all the gas fed into the treatment chamber is discharged via the first groove. Thus, contact between ambient air and the gas fed into the treatment chamber is avoided, which is necessary in respect of some treatment gases.

Preferably, in an open, moved-apart position, the two housing parts keep clear an interspace between the first and second boundary surfaces for loading and unloading the wafer by means of wafer transport means. In this manner, the wafer to be treated can be moved between the two housing parts and discharged again after a treatment.

In a further elaboration of the preferred embodiment, gas feed channels are provided in the first and/or second housing part, opening into the treatment chamber to form a gas bearing for contactlessly supporting the wafer in the treatment chamber. In use, the gas bearing keeps the wafer over its entire wafer surface at an equal distance between the housing parts and may thus compensate for any deviations in the flatness of the wafer. This renders the heat transfer from the housing parts to the contactlessly supported wafer highly uniform.

During the loading of the wafer, the position of the wafer transport means relative to at least one of the housing parts is preferably such that the gas bearing takes the wafer from the wafer transport means in the treatment chamber when the two housing parts move towards each other from the open position. Thus, the wafer in the treatment chamber can be brought into the gas bearing, so that no mechanical contact between the wafer and the housing parts takes place. This avoids the occurrence of a non-uniform heat transfer before the two housing parts are in their closed position. Further, at least one of the two boundary surfaces of one of the two housing parts may be provided with a number of wafer transport means receiving grooves which incorporate the wafer transport means when the two housing parts are in their closed position. In this manner, the wafer transport means can remain behind adjacent the wafer after the wafer has been taken in the treatment chamber by the gas bearing. This enables the wafer, after treatment, to be rapidly received by the transport means for transporting the wafer from the treatment chamber to, for instance, a subsequent treatment apparatus. This further provides the possibility of rapidly introducing a next wafer to be treated into the treatment chamber, which adds to the productivity of the apparatus.

In the preferred embodiment, the wafer transport means receiving grooves extend in radial direction, the second groove being interrupted at the location of each wafer transport means receiving groove. In spite of the fact that the second groove is interrupted, there may still be created a gas barrier at the location of the wafer transport means receiving groove in that, in accordance with a further elaboration of the invention, gas feed means preferably open into the wafer transport means receiving grooves, with the wafer transport means receiving grooves at a radially inwardly located part being in fluid connection with the first grooves. Thus, the wafer transport means receiving grooves are also sealed by gas which, in use, flows from the gas feed means. That gas can be discharged via the first groove and, by flowing radially outside to the environment, via the wafer transport means receiving grooves themselves. Thus, no contamination can diffuse in the treatment chamber via the wafer transport means receiving grooves during use of the apparatus.

In a preferred embodiment, the wafer transport means substantially comprise a transport ring provided with a number of support fingers, the transport ring having a diameter greater than the outer circumference of the two housing parts, the support fingers being connected to the transport ring and extending radially in the direction of the center of the transport ring, such that the ends of the support fingers jointly support a circumferential edge of the wafer. In use, the two housing parts can move towards each other within the transport ring, with the wafer being taken from the transport ring, to start the treatment of the wafer. After the treatment, the housing parts can subsequently move apart, with the wafer being placed on the transport ring. After that, a robot arm can remove the transport ring with wafer in lateral direction from the apparatus, and move it, for instance, to a next treatment apparatus.

In use, the first and the second housing part, in operation, have a substantially constant temperature, while in the closed position of the two housing parts, the distance between the wafer enclosed in the treatment space and the two housing parts is so small, that the heat transfer between the two housing parts and the wafer is substantially effected by heat conduction. Thus, the wafer can rapidly take over the temperature of the housing parts, the heat transfer being uniform.

The gas feed means can be provided with an inert gas source, for instance a nitrogen source. An inert gas is harmless if it is released in the environment via the gap between the first and second boundary surfaces.

The gas feed channels for the gas bearing may likewise be connected to an inert gas source. During the treatment, this prevents the wafer from entering into undesired chemical or physical reactions with the gas fed for the gas bearing.

The present invention will hereinafter be specified on the basis of an exemplary embodiment with reference to the accompanying Figures.

Figure 1:
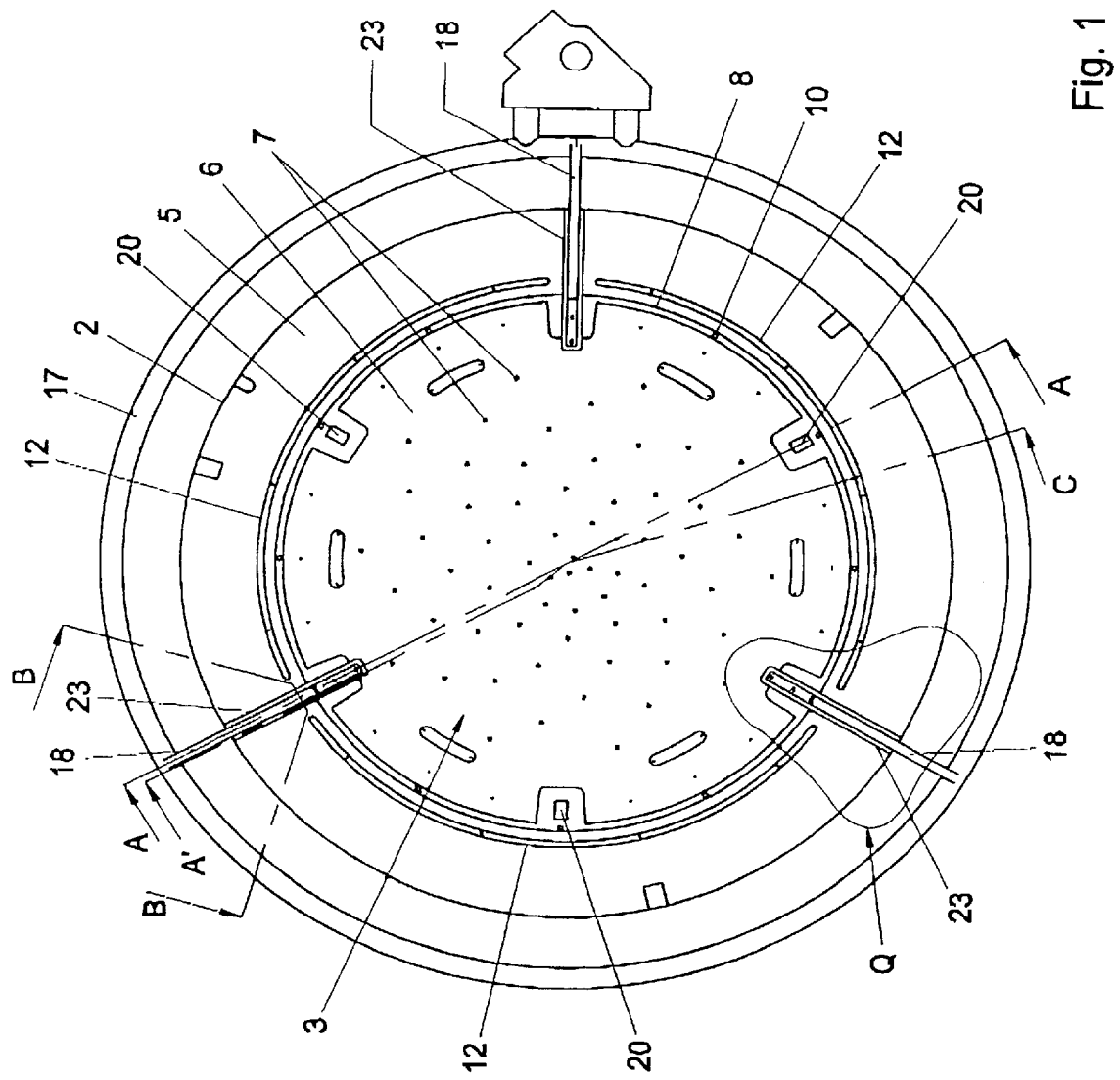
FIG. 1 is a schematic top plan view of an exemplary embodiment of the invention, in which a first housing part is not shown.
Figure 2:
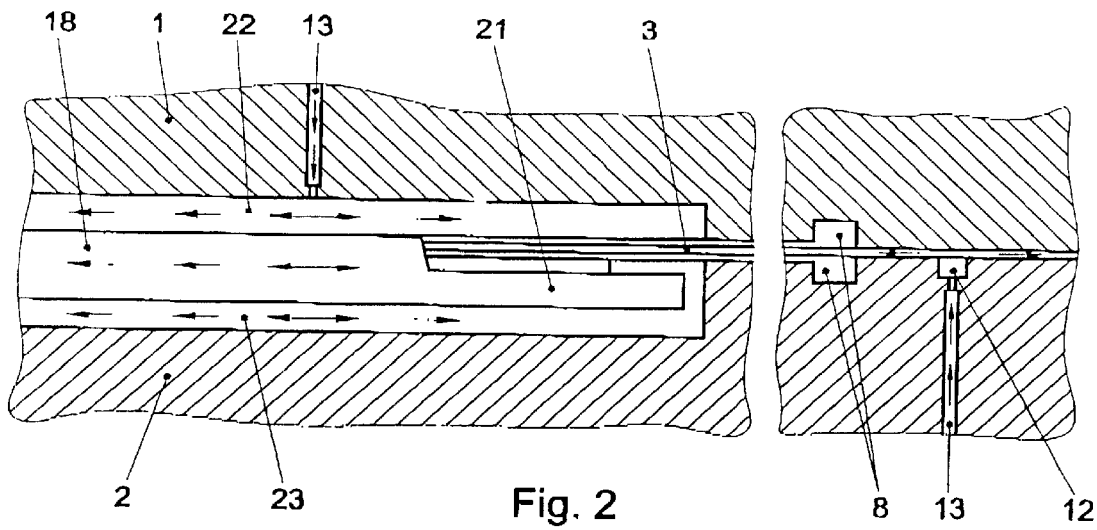
FIG. 2 shows a schematic section taken along the line A'–C of the exemplary embodiment shown in top plan view in FIG. 1.
Figure 3:
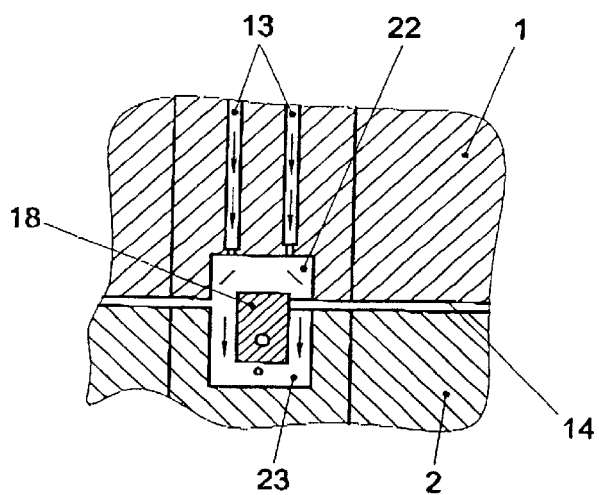
FIG. 3 shows a section taken along the line B—B of the exemplary embodiment shown in top plan view in FIG. 1.
Figure 4:
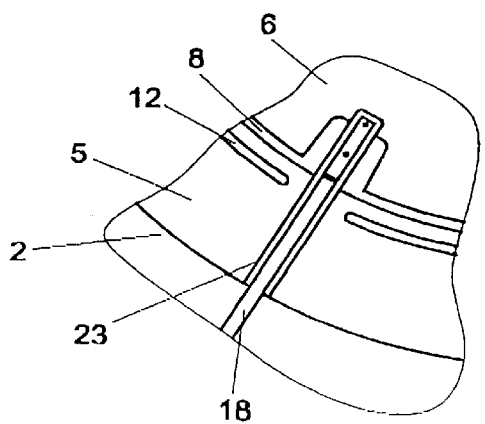
FIG. 4 shows detail Q of the exemplary embodiment shown in top plan view in FIG. 1.

The exemplary embodiment shown in the Figures comprises a first and a second housing part 1 and 2 respectively, arranged for moving towards and from each other. In a closed position, moved towards each other, the two housing parts 1, 2 bound a treatment chamber 3, the first and the second housing part 1, 2 having a first and a second boundary surface 4, 5 respectively around the treatment chamber 3. Extending between the two boundary surfaces 4, 5 is a gap 14. The two housing parts 1, 2 each provide a treatment surface 6 on a surface facing the treatment chamber 3. Extending through the housing parts 1, 2 are gas feed channels 7 which open into the treatment chamber 3 through the treatment surfaces 6. In use, these gas feed channels 7 are coupled, outside the housing parts 1, 2, to gas sources, not shown, for feeding gas to the treatment space 3 to create a gas bearing between the treatment surfaces 6 and the treatment chamber 3. Provided in the boundary surfaces 4, 5 is a first groove 8 which, in the present exemplary embodiment, extends entirely around the treatment surfaces 6. This first groove 8 is connected to gas discharge channels 10 extending outside through the housing parts 1, 2. In use, the gas discharge channels 10 are coupled to gas discharge means, not shown, which create a low pressure in gas discharge channels 10 such that the gas fed through the gas feed channels 7 is discharged via the first groove 8. Around the first groove 8, a second groove 12 is provided in the two housing parts 1, 2. This second groove 12 is connected to gas feed channels 13 extending outside through the housing parts 1, 2. In use, gas is fed to these gas feed channels 13 by gas sources not shown. This gas flows from the second groove 12 through the gap 14 between the two boundary surfaces 4, 5, radially inwards to the gas discharge groove 8 and radially outwards to the environment, as shown in FIG. 2.

The Figures show a transport ring 17 intended for loading and removing the wafer 9 into and out of the apparatus respectively. To that end, the transport ring 17 can, for instance, be displaced by a robot arm. The diameter of the transport ring 17 is greater than the diameter of the housing parts 1, 2. The transport ring 17 comprises three support fingers 18 of equal length, with the center lines of the support fingers 18 enclosing angles of 120° relative to each other. These support fingers 18 extend radially in the direction of the center of the transport ring 17, such that the ends of the support fingers 18 support the circumferential edge of the wafer 9. For that purpose, each end of each support finger 18 comprises a support lip 21.

The two boundary surfaces 4, 5 of the two housing parts 1, 2 each comprise three wafer transport means receiving grooves 22, 23 respectively, extending radially outwards through the boundary surfaces 4, 5 from the treatment chamber 3. Opposite each wafer transport means receiving groove 22 in the first boundary surface 4 lies one wafer transport means receiving groove 23 in the second bounds surface 5. The center lines of the three pairs of wafer transport means receiving grooves 22, 23 enclose angles of 120° relative to each other. At the circumference of the treatment chamber 3, the wafer transport means receiving grooves 22, 23 communicate with the first groove 8. Further, two gas feed channels 13 open into each wafer transport means receiving groove 22 at a distance radially outside the connection of the wafer transport means receiving groove 22 with the first groove 8. Each pair of opposite wafer transport means receiving grooves 22, 23 has a joint height and width such that it can receive one of the three support fingers 18 with some space when the two housing parts 1, 2 are in the closed position with the transport ring 17 in a position around the two housing parts 1, 2, as shown in the Figures. In use, gas is fed to the wafer transport means receiving grooves 22, 23 via the gas feed channels 13. That gas leaves the wafer transport means receiving grooves 22, 23 both in inward direction via the first groove 8 and the gas discharge channels 10, and in outward direction to the environment.

FIGS. 5–10 show the exemplary embodiment with the wafer 9 sitting on the three support lips 21 of the support fingers 18 of the transport ring 17. The Figures represent three steps during the operation of bringing the two housing parts 1, 2 together. The sections shown in FIGS. 5–7 intersect a support finger 18 in a pair of wafer transport means receiving grooves 22, 23. The sections shown in FIGS. 8–10 only intersect the pair of wafer transport means receiving grooves 22, 23 along the same support finger 18. Around the wafer 9, a centering ring 19 is disposed on the support lips 21, so that during a movement of the transport ring 17 or during a treatment in the treatment chamber 3, the wafer 9 cannot fall from the support lips 21. Further, the centering ring 19 should avoid the creation of a radial temperature gradient in the wafer 9 due to radial heat transfer during transport, if the wafer 9 has a temperature different from the environment.

Figure 5:
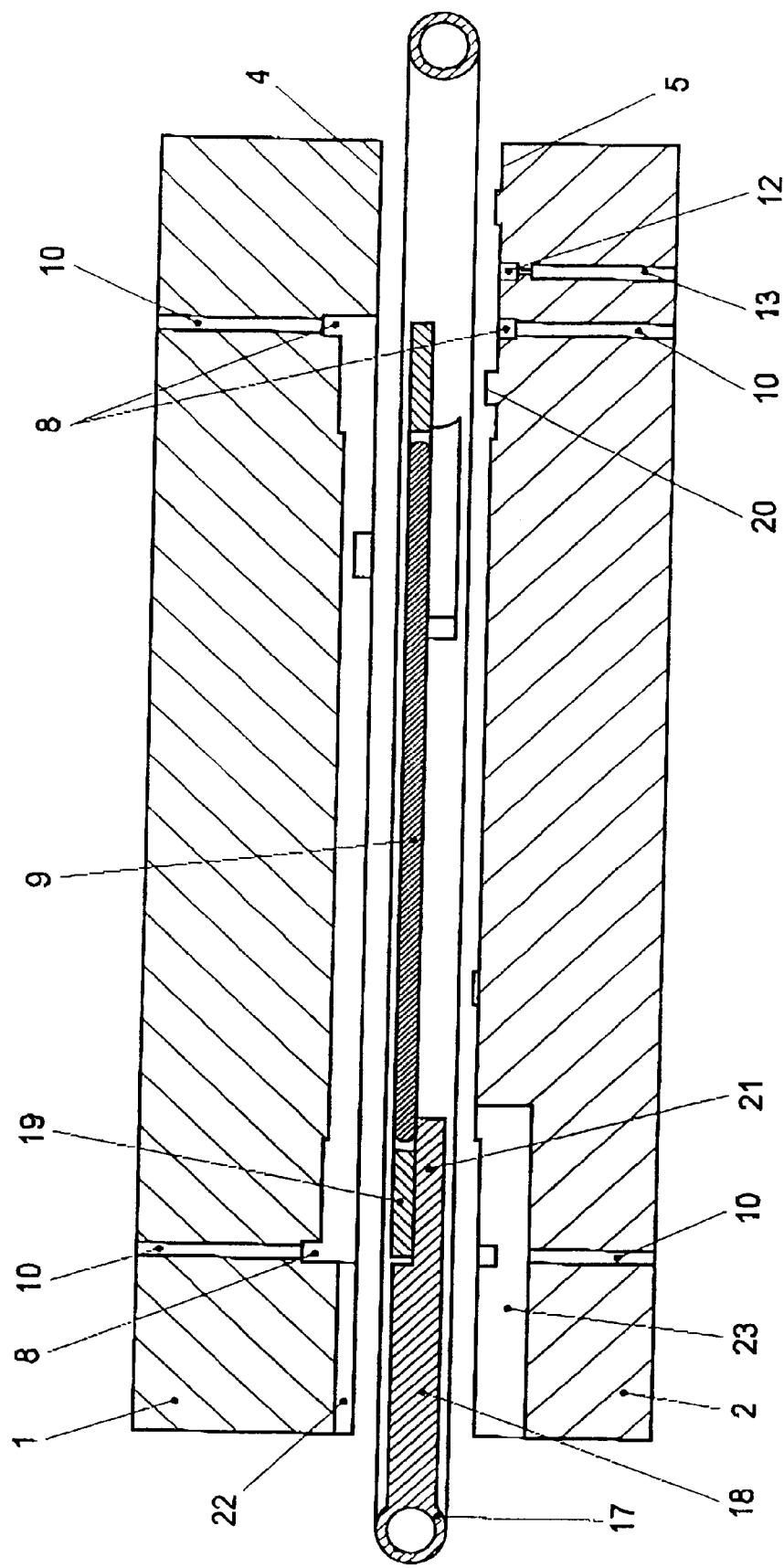
FIG. 5 shows a schematic section taken along the line A—A of the exemplary embodiment shown in top plan view in FIG. 1, the exemplary embodiment being in an open position.
Figure 8:
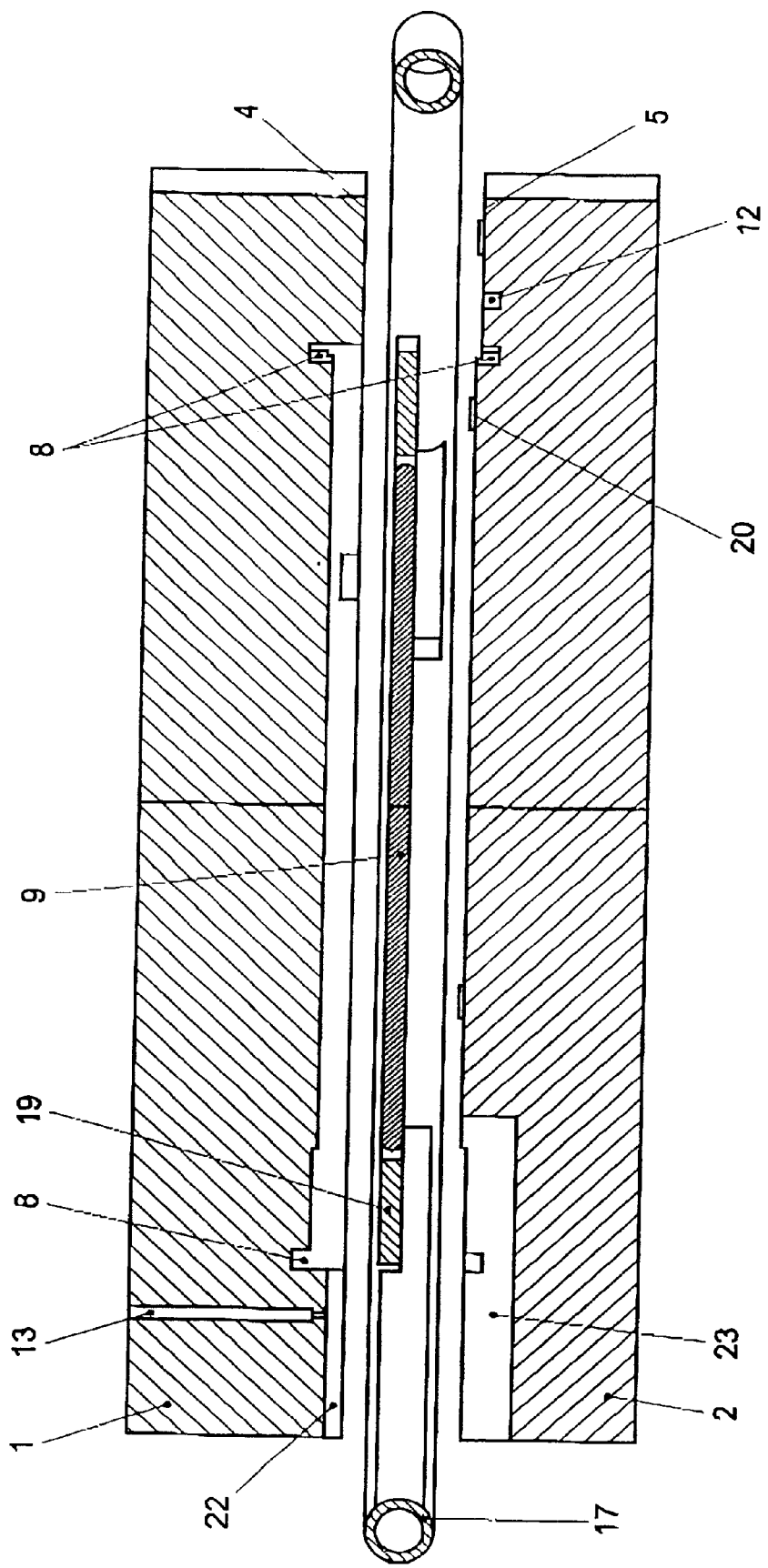
FIG. 8 shows a schematic section taken along the line A'–C of the exemplary embodiment shown in top plan view in FIG. 1, the exemplary embodiment being in an open position.

FIGS. 5 and 8 show the exemplary embodiment in an open starting position, with the transport ring 17 being held between the housing parts 1, 2 parallel to the treatment surfaces 6, for instance by a robot arm not shown. The center of the transport ring 17 is centered between the centers of the two housing parts 1, 2, so that the wafer 9 is located right between the two treatment surfaces 6. The position of the transport ring 17 is such that the support fingers 18 are located right between the wafer transport means receiving grooves 22 and 23 of the first and the second boundary surface 4 and 5 respectively. Thus, the two housing parts 1, 2 can be moved towards each other for receiving the wafer in the treatment chamber 3 for a temperature treatment. For that purpose, the two housing parts 1, 2 have each been brought to a specific treatment temperature by a heat control, not shown. Further, for the desired uniform temperature treatment, gas is fed to the gas feed channels 7 and 13 and discharged via the gas discharge channels 10, so that the gas bearing is formed and contamination of the treatment chamber 3 can be avoided.

Figure 6:
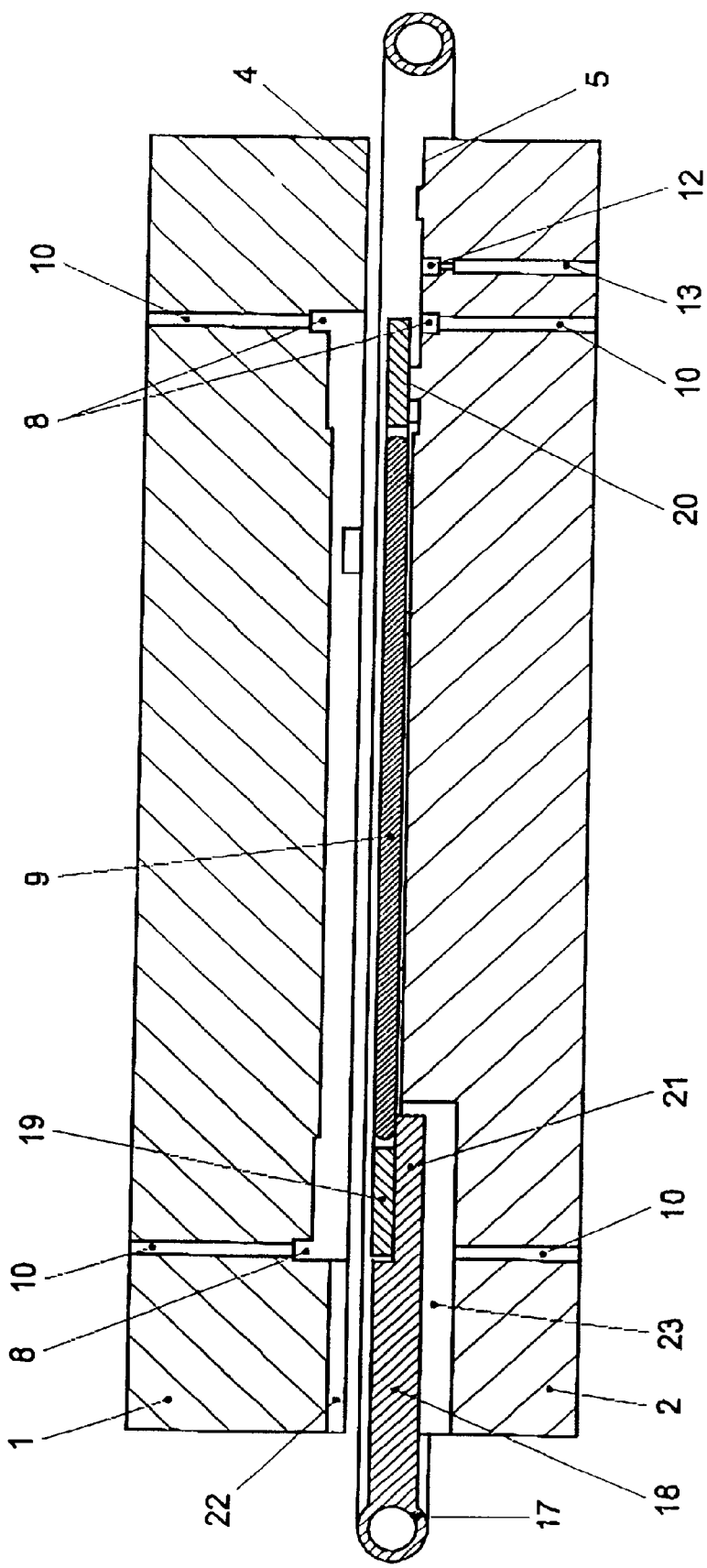
FIG. 6 shows a similar section as in FIG. 5, with the exemplary embodiment being in a partially closed position.
Figure 9:
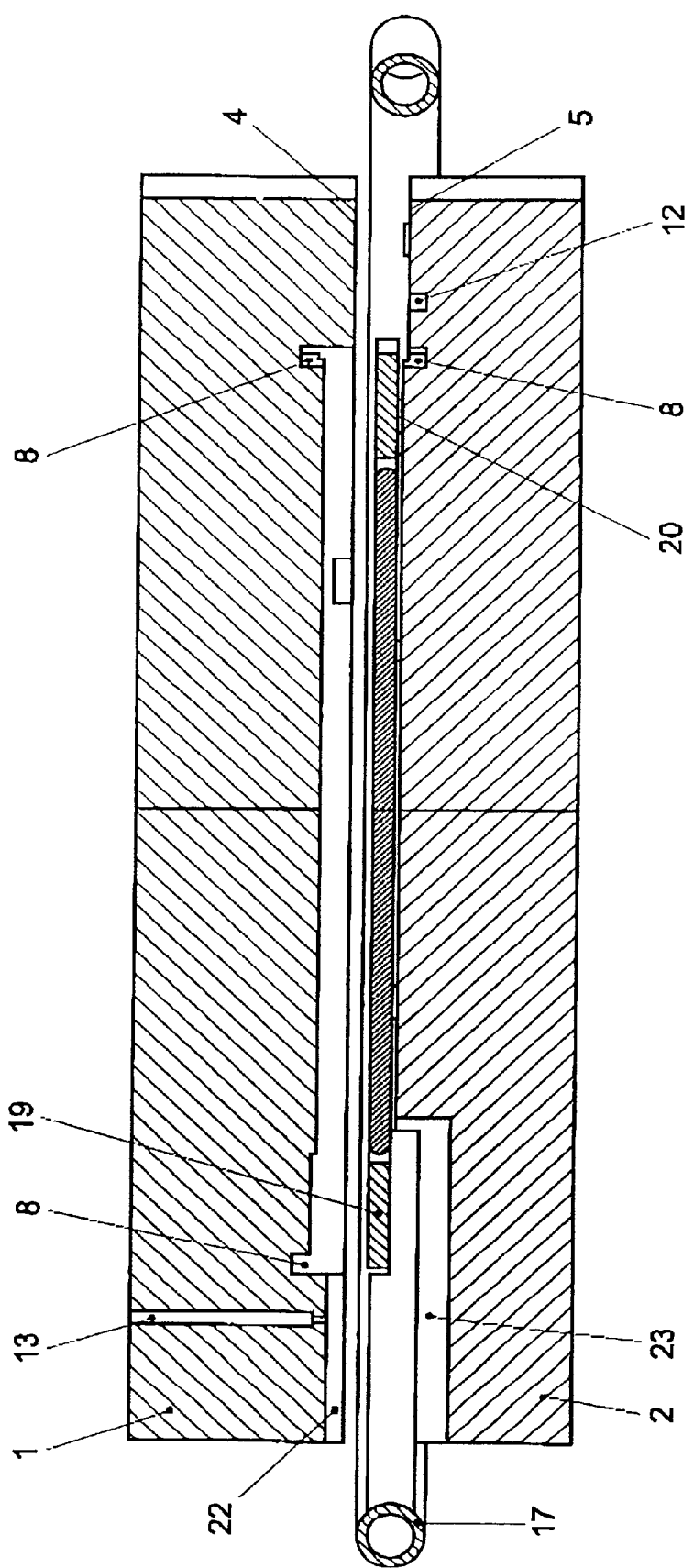
FIG. 9 shows a similar section as in FIG. 8, the exemplary embodiment being in a partially closed position.

In FIGS. 6 and 9, the second housing part 2 has been moved to the first housing part 1, so that the wafer 9 contacts the gas bearing formed by the gas flowing from the gas feed channels 7 from the second housing part 2. This involves the gas flowing radially outwards under the wafer 9 to the first groove 8, along which the gas is discharged via the gas discharge channels 10. The gas streams are such that they center the wafer on the second housing part 2 within the second boundary surface 5. The centering ring 19 contacts three support projections 20 provided on the second housing part 2 between the treatment surface 6 and the first groove 8, diametrically opposite each wafer transport means receiving groove 23.

Figure 7:
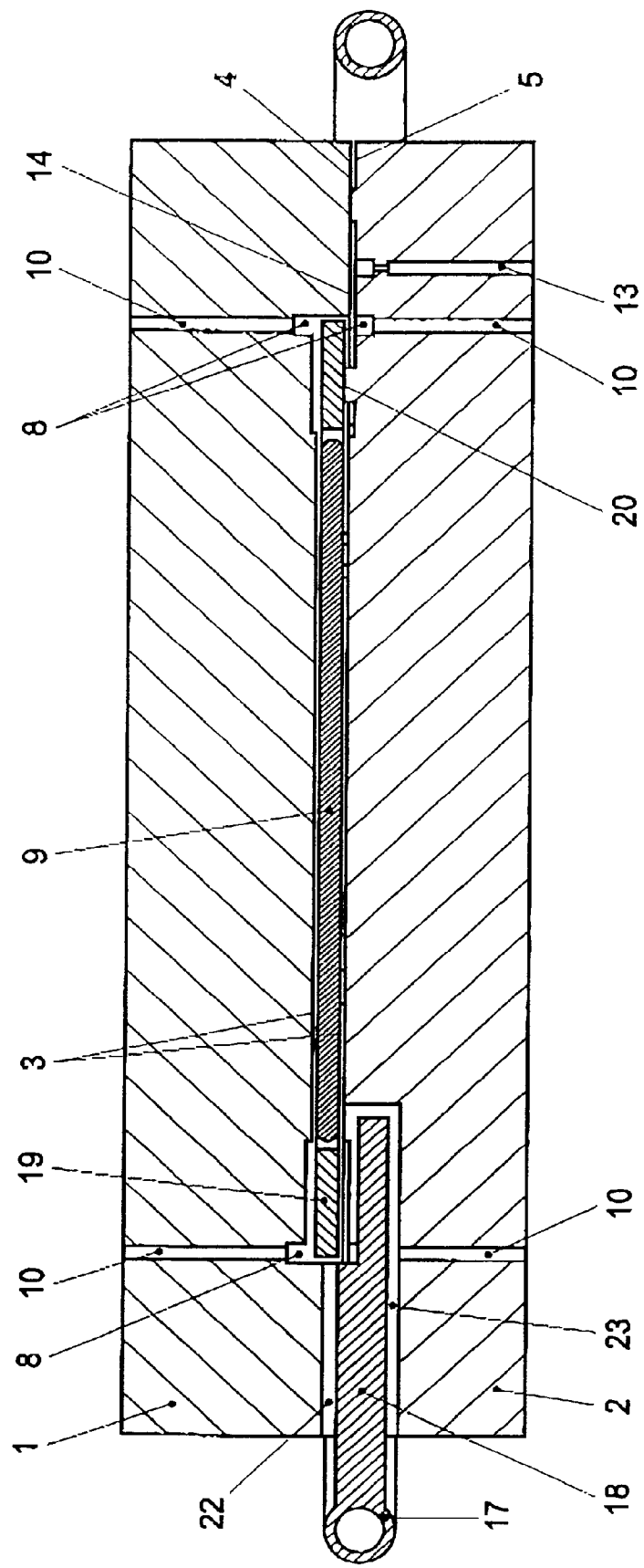
FIG. 7 shows a similar section as in FIG. 5, with the exemplary embodiment being in a closed position.
Figure 10:
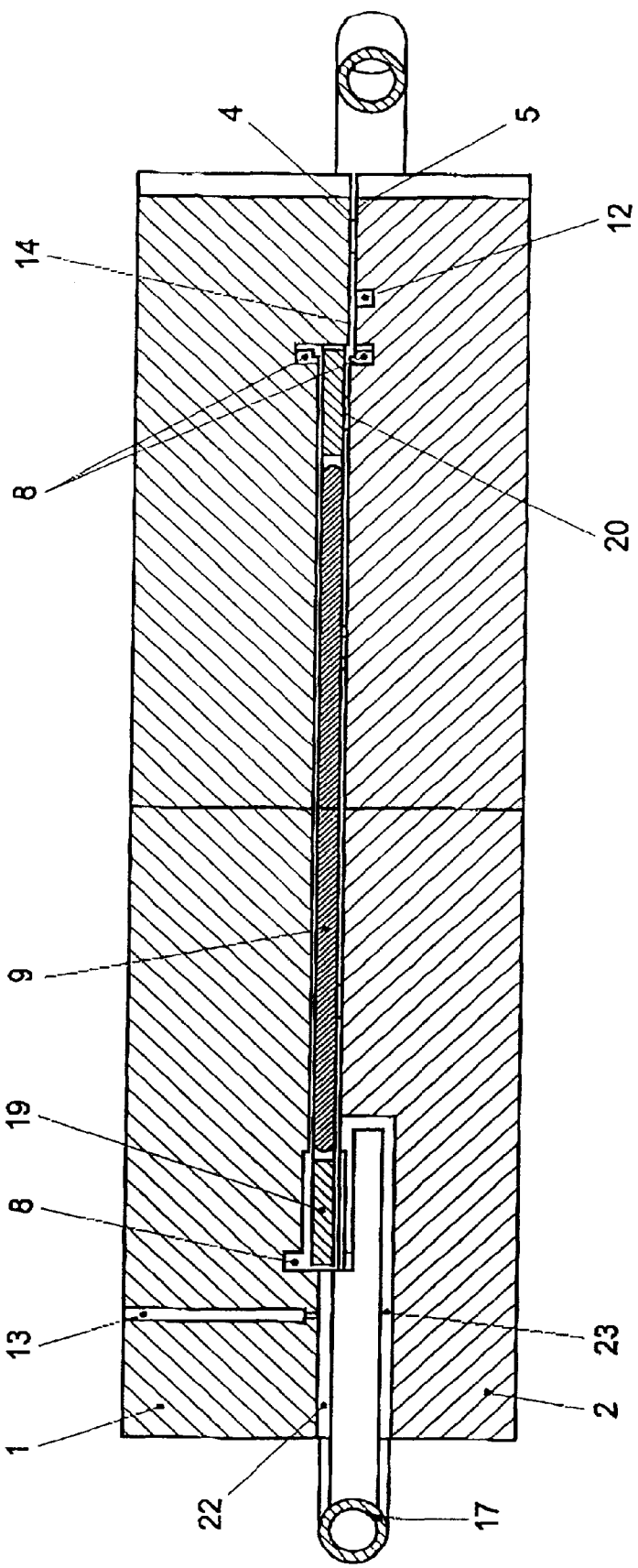
FIG. 10 shows a similar section as in FIG. 8, the exemplary embodiment being in a closed position.

In FIGS. 7 and 10, the two housing parts 1, 2 are in their closed position, with the centering ring 19 sitting on the three support projections 20. The wafer 9 has been taken from the support lips 21 by the gas bearing which centers the wafer 9 contactlessly between the two treatment surfaces 6 in the treatment chamber 3. In this case, the gas bearing is formed by the gas fed to the treatment chamber 3 from the gas feed channels 7 of the two housing parts 1, 2 and flowing radially along the wafer 9 to the first groove 8. The distance between the upper and lower sides of the wafer 9 and the two treatment surfaces 6 is relatively small. Accordingly, the heat transfer through conduction between the wafer 9 and the two housing parts 1, 2 is relatively great, so that the wafer 9 takes over the treatment temperature of the two housing parts 1, 2 relatively fast. This treatment temperature is uniform over the two treatment surfaces 6 of the two housing parts 1, 2, so that temperature gradients in the wafer 9 in radial direction are hardly created.

The heat transfer by conduction between the two housing parts 1, 2 and the wafer 9 is very small when the two housing parts 1, 2 are in the open position. By moving the second housing part 2 relatively fast from this position to the first housing part 1 for closing, the heat treatment can be started at a point of time that can be accurately determined. By subsequently moving the second housing part 2 from the first housing part 1 again relatively fast, the heat transfer can also be stopped at a point of time that can be accurately determined. In this manner, the wafer 9 can undergo a highly uniform heat treatment within a treatment period that can be accurately determined, with the wafer 9 hardly undergoing any temperature gradients in radial direction.

During the temperature treatment in the above-described manner, gas flows from the gas feed channels 13 into the second groove and into the gaps 14. This gas stream is such that it opposes the possibility of gas from the environment outside the two housing parts 1, 2 diffusing into the treatment chamber 3 via the gaps 14. The gas flowed from the gas feed channels 13 is partially discharged through the gas discharge channels 10 via the first groove 8 and partially flows outwards through the gaps 14. Preferably, the gas flow rate is minimally one centimeter per second. Preferably, in the gap 14 located radially outside the second groove 12, a Peclet number greater than 10 prevails. The dimensionless Peclet number indicates the ratio between convective and diffusive transport and is helpful in estimating the concentration profile of the diffusing component analytically. The convective transport is the transport of the gas which flows out from the second groove 12 through the gap 14. Diffusive transport is the transport of gas which is outside of the reactor and which tends to penetrate gap 14 by diffusion. In case of small Peclet numbers, the diffusive transport is dominating, while for high Peclet numbers convective transport is dominating. It is important to notice that in this one-dimensional model no velocity differences exist. In other words, the velocity of the gas in the gap 14 is constant at the area of interest and for example no recirculations are present.

Figure 11:
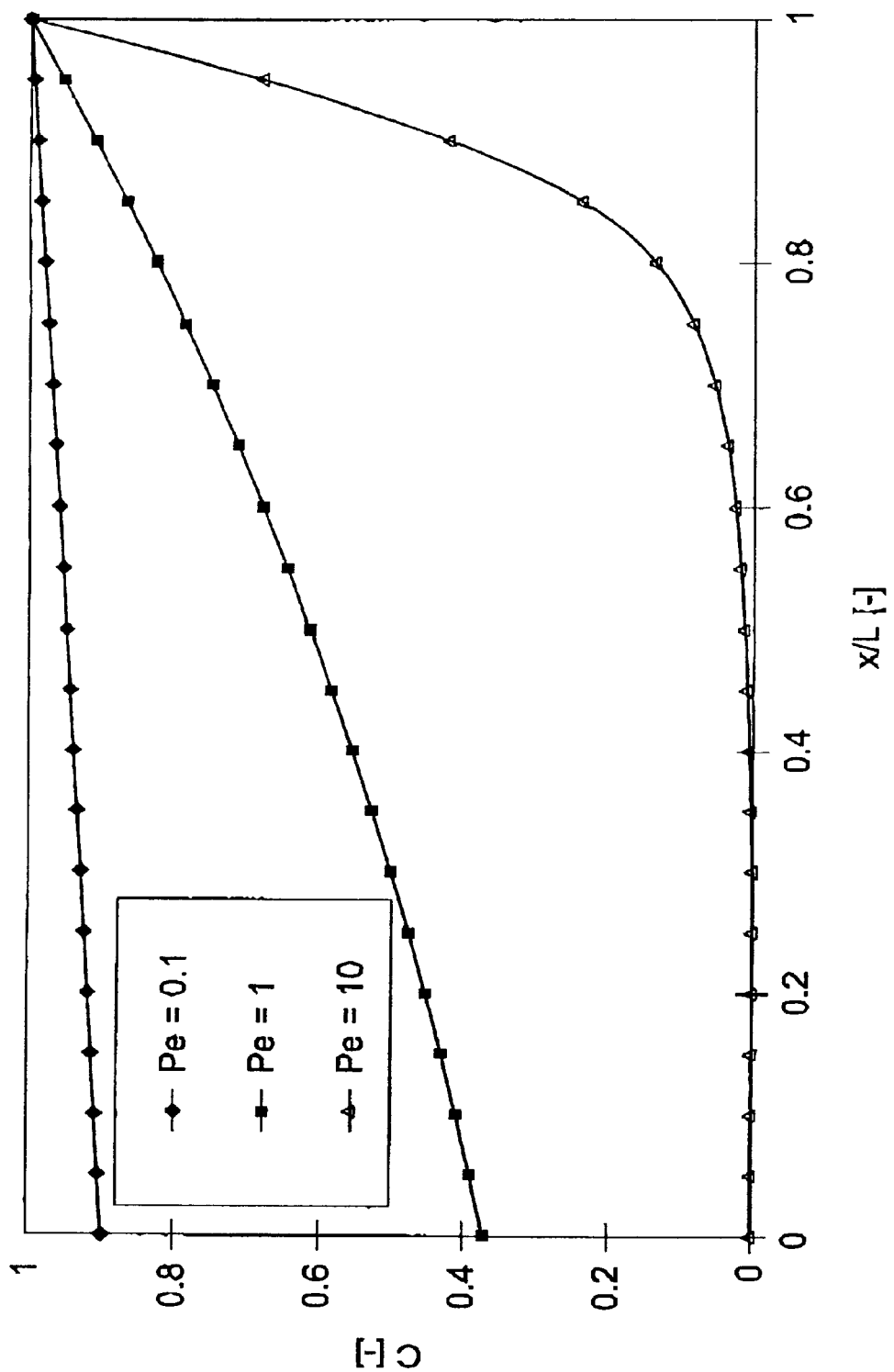
FIG. 11 shows a plot of the mol fraction of the diffusing component versus the dimensionless position in the gap.
Figure 12:
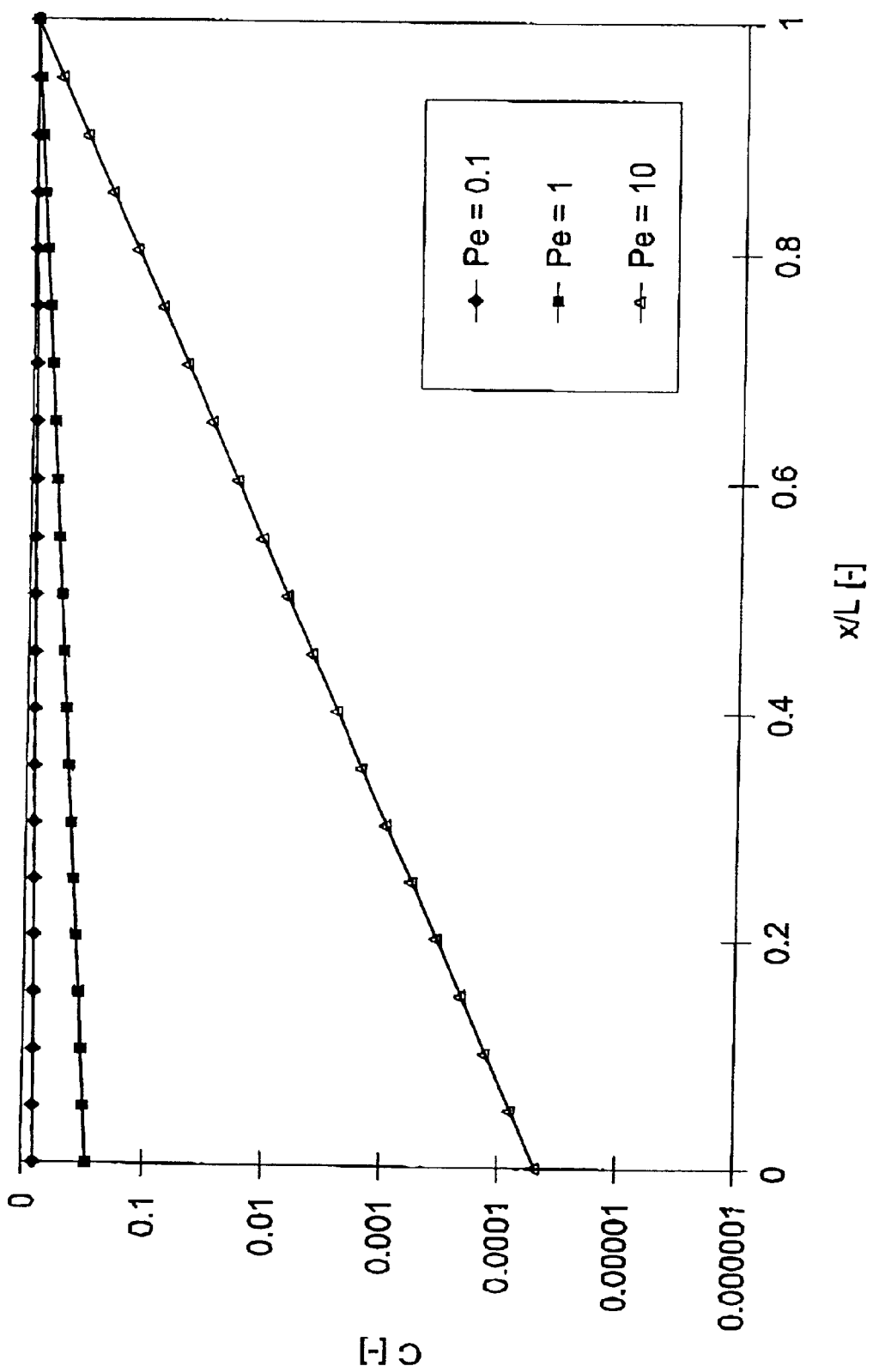
FIG. 12 is similar to FIG. 11, the scale on the vertical axis being logarithmic.

In FIGS. 11 and 12 the mol fraction of the "diffusing" component, e.g. outside air, is plotted versus the dimensionless position for various positions. At dimensionless position 1, which is at the radial outside end of gap 14, the mol fraction of the diffusing component is unity. At dimensionless position 0, which corresponds to the position of the second groove 12 in the gap 14, the flowing component is added. In between, the concentration is determined by the ratio between convection and diffusion. For low Peclet numbers, it is obvious that the diffusing component is present throughout the domain, while for high Peclet numbers the diffusing component is present only near the outlet (dimensionless position 1).

The only difference between FIGS. 11 and 12 is the scale of the Y-axis, which is logarithmic in FIG. 12. This Figure clearly demonstrates that the Peclet number should be greater than 10 in order to reduce the concentration of the diffusing component below the PPM-level.

The Peclet-number is defined as:

$$Pe = \frac{v \cdot L}{D}$$

wherein v is the gas velocity of the "flowing" component in $[m.s^{-1}]$, D is the diffusion coefficient of the gas pair "flowing" and "diffusing" component in $[m^2.s^{-1}]$, and L is the characteristic distance in [m], i.e. the radial length of gap 14. The characteristic distance is typically the distance between the inlet and outlet of the "flowing" component.

To estimate the minimal required velocity of the "flowing" component, the following variables can be used:

reduction of "diffusing" component to 1 ppm, Pe=14 reduction of "diffusing" component to 10 ppm, Pe=11.5 diffusion coefficient for $N_2/H_2$ at 1000° C. and 1 atm: $D=8.5 \cdot 10^{-4}$ $m^2 s^{-1}$ diffusion coefficient for $N_2/H_2$ at 27° C. and 1 atm: $D=7.7 \cdot 10^{-5}$ $m^2 s^{-1}$ diffusion coefficient for $N_2/O_2$ at 1000° C. and 1 atm: $D=2.3 \cdot 10^{-4}$ m$^2$s$^{-1}$ diffusion coefficient for $N_2/O_2$ at 27° C. and 1 atm: $D=2.0 \cdot 10^{-5}$ m$^2$s$^{-1}$ characteristic distance: L is dependent on problem.

For example, when the characteristic distance is 0.02 m, the temperature is 1000° C., the pressure is 1 atm, nitrogen is used as "flowing" component to prevent contamination of oxygen by diffusion below 10 ppm, the minimal nitrogen velocity can be calculated according to:

$$v = \frac{Pe \cdot D}{L} = \frac{11.5 \cdot 2.3 \cdot 10^{-4}}{0.02} = 0.13 \, m \cdot s^{-1}$$

Likewise, the minimal velocity can be calculated for other situations.

The gas that is fed to the treatment chamber 3 via the gas feed channels 7 may be a process gas which, by means of a physical or chemical process, performs a treatment on the surfaces of the wafer 9 at the treatment temperature, for instance deposition or etching. The gas may also be an inert gas solely intended to create the gas bearing between the housing parts 1, 2 and the wafer 9.

FIGS. 1–10 do not show how the various gas feed and discharge channels are connected to gas sources or exhaust installations respectively. For clarity's sake, provisions such as the heat control of the two housing parts 1, 2, the required sensors and control means for temperature, gas flow rates, positions of the housing parts 1, 2 and a control of said measuring and regulating means have not been shown, either.

It may be understood that the invention is not limited to the exemplary embodiment described, but that various modifications are possible within the framework of the invention.

Thus, the two housing parts 1, 2 may be provided in different shapes, for instance round or angular, and made from different materials, for instance a metal or alloy.

In addition, the forms and positions of the first and second grooves 8 and 12 respectively may be varied in many ways in the first and/or second boundary surface. Further, the housing parts 1, 2 could be provided with two or more first, concentric grooves 8 and with two or more second, concentric grooves 12 extending radially outside the first groove or grooves 8 around the treatment chamber 3.

What is claimed is:

1. An apparatus for treating a wafer manufactured from semiconducting material, the apparatus comprising a first and a second housing part arranged for movement away from and towards each other, the two housing parts in a closed position, moved together, bounding a treatment chamber, at least one gas feed channel being provided in the first and/or second housing part which opens into the treatment chamber, the first and the second housing part around the treatment chamber being provided with a first and second boundary surface respectively, while in the closed position a gap is present between the first and the second boundary surface for discharging the gas fed into the treatment chamber in radially outward direction, wherein in at least one of the two boundary surfaces, there is provided a first groove connected to gas discharge means, while in at least one of the two boundary surfaces, there is provided a second groove connected to gas feed means, both the first and the second groove extending substantially along the circumference of the treatment chamber, the first groove being located radially within the second groove, and, in use, the pressure created by the gas feed means being such that from the second groove, gas flows both in radial inward and in radial outward direction in the gap between the first and the second boundary surface, wherein in the first and/or the second housing part, gas feed channels are provided which open into the treatment chamber through a treatment surface facing the treatment chamber to form a gas bearing in the treatment chamber for supporting the wafer contactlessly in the treatment chamber.

2. An apparatus according to claim 1, wherein the gas feed means and the length (L) of the gap are chosen such that, with a given diffusion coefficient (D) of a contamination in the gas flowing radially outwards through the gap, the Péclet number in the gap located radially outside the second groove is greater than 10, the Péclet number Pe being defined by the following formula:

$$Pe = \frac{v \cdot L}{D}$$

wherein v is the gas flow rate in the gap, L is the length of the gap viewed in flowing direction, and D is the diffusion coefficient of a contamination in the gas flowing radially outwards through the gap.

3. An apparatus according to claim 1, wherein the gas feed means are dimensioned for providing a gas flow rate in the gap of the gas flowing radially outwards of minimally 1 centimeter per second.

4. An apparatus according to claim 1, wherein the discharge means are dimensioned for creating a sufficient pressure such that substantially all the gas fed into the treatment chamber is discharged via the first groove.

5. An apparatus according to claim 1, wherein the two housing parts in an open, moved-apart position keep clear an interspace between the first and the second boundary surface for loading and unloading the wafer by means of water transport means.

6. An apparatus according to claim 1, wherein the position of the wafer transport means relative to at least one of the housing parts is such that the gas bearing takes the wafer from the wafer transport means in the treatment chamber when the two housing parts move towards each other from the open position.

7. An apparatus according to claim 1, wherein the first and the second housing part, in operation, have a substantially constant temperature, while in the closed position of the two housing parts, the distance between the wafer enclosed in the treatment space and the two housing parts is so small that the heat transfer between the two housing parts and the wafer is substantially effected by heat conduction.

8. An apparatus according to claim 1, wherein the gas feed means comprise an inert gas source.

9. An apparatus according to claim 8, wherein the inert gas source contains nitrogen.

10. An apparatus according to claim 1, wherein the gas feed channels for the gas bearing are connected to an inert gas source.

11. An apparatus according to claim 10 wherein the inert gas source contains nitrogen.

12. An apparatus for treating a wafer manufactured from semiconducting material, the apparatus comprising a first and a second housing part arranged for movement away from and towards each other, the two housing parts in a closed position, moved together, bounding a treatment chamber, at least one gas feed channel being provided in the first and/or second housing part which opens into the treatment chamber, the first and the second housing part around the treatment chamber being provided with a first and second boundary surface respectively, while in the closed position a gap is present between the first and the second boundary surface for discharging the gas fed into the treatment chamber in radially outward direction, wherein in at least one of the two boundary surfaces, there is provided a first groove connected to gas discharge means, while in at least one of the two boundary surfaces, there is provided a second groove connected to gas feed means, both the first and the second groove extending substantially along the circumference of the treatment chamber, the first groove being located radially within the second groove, and, in use, the pressure created by the gas feed means being such that from the second groove, gas flows both in radial inward and in radial outward direction in the gap between the first and the second boundary surface, the two housing parts in an open, moved-apart position keeping clear an interspace between the first and the second boundary surface for loading and unloading the wafer by means of wafer transport means, wherein at least one of the two boundary surfaces of one of the two housing parts is provided with a number of wafer transport means receiving grooves which incorporate the wafer transport means when the two housing parts are in the closed position.

13. An apparatus according to claim 12, wherein the wafer transport means receiving grooves extend in radial direction, the second groove being interrupted at the location of each water transport means receiving groove.

14. An apparatus according to claim 13, wherein gas feed, means open into the wafer transport means receiving grooves, the wafer transport means receiving grooves at a radially inwardly located part being in fluid connection with the first grooves.

15. An apparatus according to claim 12, wherein the first and the second housing part, in operation, have a substantially constant temperature, while in the closed position of the two housing parts, the distance between the wafer enclosed in the treatment space and the two housing parts is so small that the heat transfer between the two housing parts and the wafer is substantially effected by heat conduction.

16. An apparatus according to claim 12, wherein the gas feed means comprise an inert gas source.

17. An apparatus according to claim 12, wherein the gas teed channels for the gas bearing are connected to an inert gas source.

18. An apparatus for treating a wafer manufactured from semiconducting material, the apparatus comprising a first and a second housing part arranged for movement away from and towards each other, the two housing parts in a closed position, moved together, bounding a treatment chamber, at least one gas feed channel being provided in the first and/or second housing part which opens into the treatment chamber, the first and the second housing part around the treatment chanter being provided with a first and second boundary surface respectively, while in the closed position a gap is present between the first and the second boundary surface for discharging the gas fed into the treatment chamber in radially outward direction, wherein in at least one of the two boundary surfaces, there is provided a first groove connected to gas discharge means, while in at least one of the two boundary surfaces, there is provided a second groove connected to gas teed means, both the first and the second groove extending substantially along the circumference of the treatment chamber, the first groove being located radially within the second groove, and, in use, the pressure created by the gas feed means being such that from the second groove, gas flows both in radial inward and in radial outward direction in the gap between the first and the second boundary surface, the two housing parts in an open, moved-apart position keeping clear an interspace between the first and the second boundary surface for loading and unloading the wafer by means of wafer transport means, wherein the wafer transport means substantially comprises a transport ring provided with a number of support fingers, the transport ring having a diameter greater than the outer circumference of the two housing parts, the support fingers being connected to the transport ring and extending radially in the direction of the center of the transport ring, such that the ends of the support fingers jointly support a circumferential edge of the wafer.

19. An apparatus according to claim 18, wherein at least one of the two boundary surfaces of one of the two housing parts is provided with a number of wafer transport means receiving grooves which incorporate the support fingers when the two housing parts are in the closed position.

20. An apparatus according to claim 19, wherein the wafer transport means receiving grooves extend in radial direction, the second groove being interrupted at the location of each wafer transport means receiving groove.

21. An apparatus according to claim 20, wherein gas teed means open into the wafer transport means receiving grooves, the wafer transport means receiving grooves at a radially inwardly located part being in fluid connection with the first grooves.

22. An apparatus according to claim 18, wherein the first and the second housing part, in operation, have a substantially constant temperature, while in the closed position of the two housing parts, the distance between the wafer enclosed in the treatment space and the two housing parts is so small that the heat transfer between the two housing parts and the wafer is substantially effected by heat conduction.

23. An apparatus according to claim 16, wherein the gas feed means comprise an inert gas source.

24. An apparatus according to claim 18, wherein the gas feed channels for the gas bearing are connected to an inert gas source.

* * * * *

UNITED STATES PATENT AND TRADEMARK OFFICE
CERTIFICATE OF CORRECTION

PATENT NO. : 6,551,404 B2
DATED : April 22, 2003
INVENTOR(S) : Gert-Jan Snijders et al.

It is certified that error appears in the above-identified patent and that said Letters Patent is hereby corrected as shown below:

<u>Title page,</u>
Item [57], ABSTRACT,
Line 3, "front" should read -- from --;

<u>Column 10,</u>
Line 8, "chamber." should read -- chamber, and wherein at least one of the two boundary surfaces of one of the two housing parts is provided with a number of wafer transport means receiving grooves which incorporate a wafer transport means when the two housing parts are in the closed position. --;

<u>Column 11,</u>
Line 43, "teed" should read -- feed --;
Line 53, "chanter" should read -- chamber --;

<u>Column 12,</u>
Lines 7 and 35, "teed" should read -- feed --; and
Line 48, "16" should read -- 18 --.

Signed and Sealed this

Third Day of May, 2005

JON W. DUDAS
*Director of the United States Patent and Trademark Office*